United States Patent
Kanaoka et al.

(10) Patent No.: US 9,937,520 B2
(45) Date of Patent: Apr. 10, 2018

(54) SUBSTRATE TREATING METHOD

(71) Applicant: SCREEN Holdings Co., Ltd., Kyoto (JP)

(72) Inventors: Masashi Kanaoka, Kyoto (JP); Takehiro Wajiki, Kyoto (JP); Shinichi Takada, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 0 days.

(21) Appl. No.: 14/721,346

(22) Filed: May 26, 2015

(65) Prior Publication Data

US 2015/0352591 A1 Dec. 10, 2015

(30) Foreign Application Priority Data

Jun. 4, 2014 (JP) .................................. 2014-115693

(51) Int. Cl.
*B05D 1/00* (2006.01)
*H01L 21/67* (2006.01)

(52) U.S. Cl.
CPC .......... *B05D 1/002* (2013.01); *H01L 21/6715* (2013.01)

(58) Field of Classification Search
None
See application file for complete search history.

(56) References Cited

U.S. PATENT DOCUMENTS

| 6,270,579 B1 | 8/2001 | Subramanian et al. ...... 118/663 |
| 2003/0194878 A1 | 10/2003 | Miya .............................. 438/745 |
| 2005/0158473 A1 | 7/2005 | Raykin et al. ................. 427/299 |
| 2007/0044823 A1 | 3/2007 | Yamamoto et al. ............ 134/33 |
| 2008/0016714 A1 | 1/2008 | Kaneyama et al. ............ 34/317 |
| 2008/0041420 A1 | 2/2008 | Sekiguchi et al. .............. 134/18 |
| 2009/0073394 A1 | 3/2009 | Miyagi ........................... 355/27 |
| 2012/0260952 A1* | 10/2012 | Nonaka ............. H01L 21/02052 134/30 |

FOREIGN PATENT DOCUMENTS

| JP | 2003-303804 A | 10/2003 |
| JP | 2007-67080 A | 3/2007 |
| JP | 2007-531322 A | 11/2007 |
| JP | 2008-028226 | 2/2008 |

(Continued)

OTHER PUBLICATIONS

Notification of Reasons for Refusal dated Nov. 14, 2017 issued in corresponding Japanese Patent Application No. 2014-115693.

*Primary Examiner* — Michael P. Rodriguez
(74) *Attorney, Agent, or Firm* — Ostrolenk Faber LLP

(57) ABSTRACT

A nozzle starts discharging a processing liquid while a spin chuck holds and rotates a substrate having a water-repellent film being formed on a surface thereof. The processing liquid is discharged to a position spaced away from the center of the substrate by a preset distance, and flows so as to converge into one stream on the substrate immediately after discharge of the processing liquid starts. This achieves suppression of the minute water droplets. Moreover, the nozzle is moved toward outside of the substrate while discharging the processing liquid successively. This allows entire flow of the processing liquid to move toward outside of the substrate while the processing liquid converging into one stream on the substrate is maintained. Here, inside the flow of the processing liquid is a dried region.

16 Claims, 14 Drawing Sheets

(56) References Cited

FOREIGN PATENT DOCUMENTS

| | | |
|---|---|---|
| JP | 2009-071026 | 4/2009 |
| JP | 2011-014935 A | 1/2011 |
| JP | 2012-222237 | 11/2012 |
| KR | 20100102951 A * | 9/2010 |
| WO | WO 2005/119748 A1 | 12/2005 |

* cited by examiner

Fig.1A (PRIOR ART)
Fig.1B (PRIOR ART)
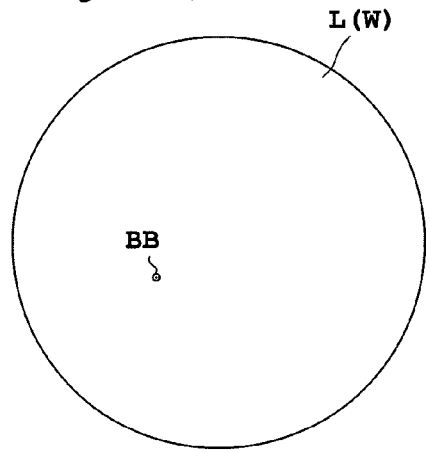
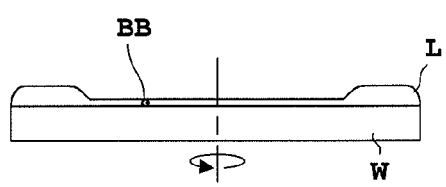
Fig.1C (PRIOR ART)
Fig.1D (PRIOR ART)
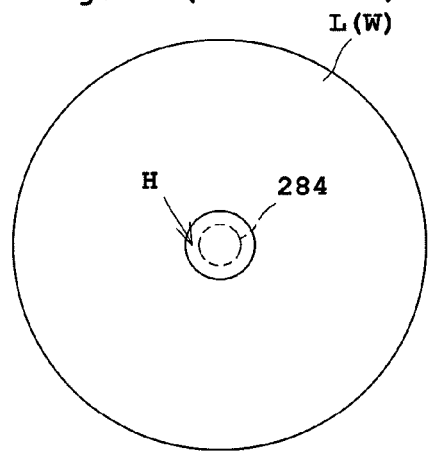
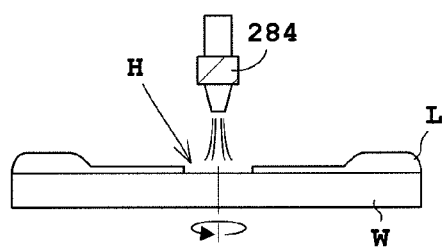
Fig.1E (PRIOR ART)
Fig.1F (PRIOR ART)
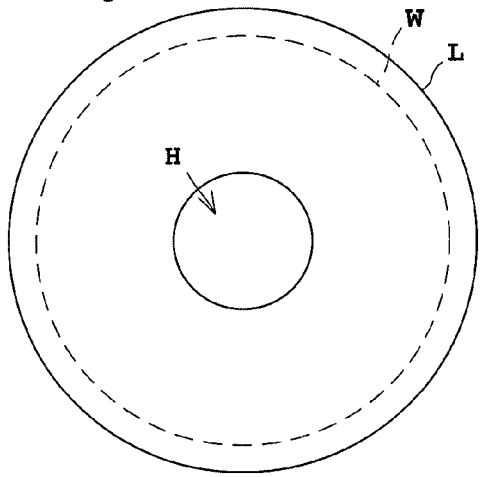
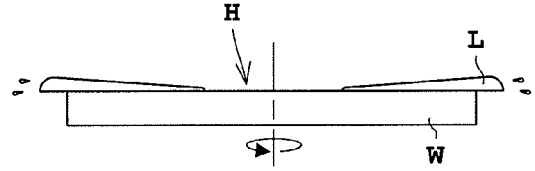

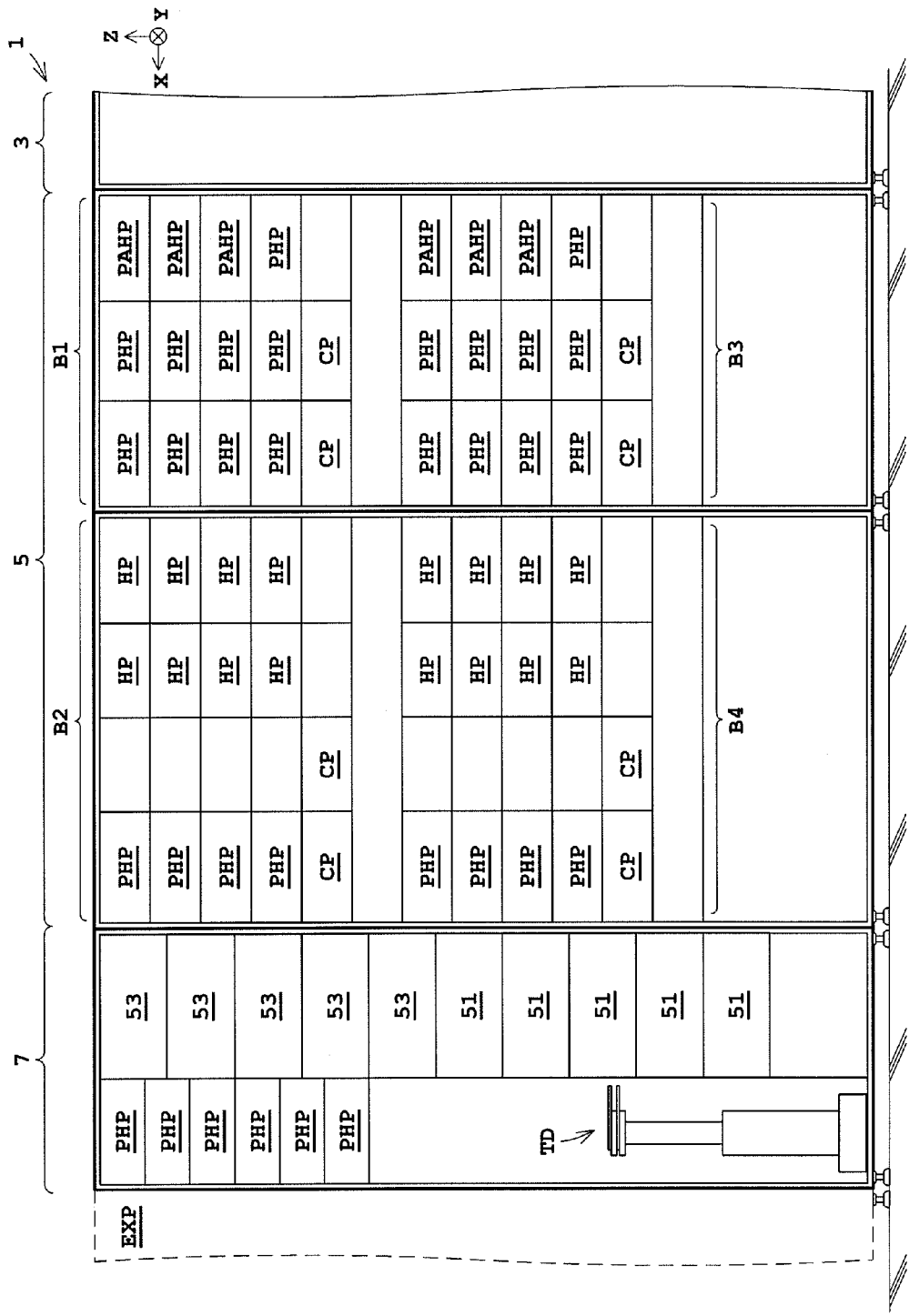

Fig.10

| NOZZLE DISTANCE FROM CENTER OF SUBSTRATE [mm] | LIQUID RESIDUE DETERMINATION RESULT | EVALUATION RESULT |
|---|---|---|
| 0 | NG | WITH LIQUID RESIDUE AROUND CENTER OF SUBSTRATE |
| 1 | NG | |
| 2 | NG | |
| 3 | NG | |
| 4 | NG | |
| 5 | NG | |
| 6 | NG | |
| 7 | NG | |
| 8 | OK | WITH NO LIQUID RESIDUE ON SUBSTRATE |
| 9 | OK | |
| 10 | OK | |
| 11 | OK | |
| 12 | OK | |
| 13 | OK | |
| 14 | NG | CENTER OF SUBSTRATE UNCLEANED |
| 15 | NG | |
| 16 | NG | |
| 17 | NG | |
| 18 | NG | |
| 19 | NG | |
| 20 | NG | |

Fig.11

| NUMBER OF ROTATIONS OF SUBSTRATE [rpm] | LIQUID RESIDUE DETERMINATION RESULT | EVALUATION RESULT |
|---|---|---|
| 50 | NG | WITH LIQUID RESIDUE AROUND CENTER OF SUBSTRATE |
| 100 | NG | |
| 150 | NG | |
| 200 | OK | WITH NO LIQUID RESIDUE ON SUBSTRATE |
| 250 | OK | |
| 300 | OK | |
| 350 | OK | |
| 400 | OK | |
| 500 | OK | |
| 600 | OK | |
| 700 | OK | |
| 800 | OK | |
| 900 | NG | CENTER OF SUBSTRATE UNCLEANED |
| 1000 | NG | |

Fig.12

| FLOW RATE OF PROCESSING LIQUID [ml/min] | LIQUID RESIDUE DETERMINATION RESULT | EVALUATION RESULT |
|---|---|---|
| 1000 | NG | WITH LIQUID RESIDUE AROUND CENTER OF SUBSTRATE |
| 900 | NG | |
| 800 | NG | |
| 700 | OK | WITH NO LIQUID RESIDUE ON SUBSTRATE |
| 600 | OK | |
| 500 | OK | |
| 400 | OK | |
| 300 | OK | |
| 200 | NG | CENTER OF SUBSTRATE UNCLEANED |
| 100 | NG | |

Fig.13

| FLOW RATE OF PROCESSING LIQUID [ml/min] | NOZZLE DISTANCE FROM CENTER OF SUBSTRATE [mm] | | | | | | | |
|---|---|---|---|---|---|---|---|---|
| | 7 | 8 | 9 | 10 | 11 | 12 | 13 | 14 |
| 900 | | | | NG | | | | |
| 800 | | | ng | NG | ng | ng | | |
| 700 | NG | ng | ok | OK | ok | ok | ng | |
| 600 | NG | ok | ok | OK | ok | ok | ok | NG |
| 500 | NG | OK | OK | OK | OK | OK | OK | NG |
| 400 | | ng | ok | OK | ok | ok | ng | |
| 300 | | ng | ng | OK | ok | ng | | |
| 200 | | | ng | NG | ng | | | |
| 100 | | | | NG | | | | |

SUBSTRATE TREATING METHOD

CROSS-REFERENCE TO RELATED APPLICATIONS

This application claims priority to Japanese Patent Application No. 2014-115693 filed Jun. 4, 2014 the subject matter of which is incorporated herein by reference in entirety.

TECHNICAL FIELD

The present invention relates to a substrate treating method treating a substrate such as a semiconductor substrate, a glass substrate for liquid crystal display, a photo mask glass substrate, and an optical disk substrate.

BACKGROUND ART

A substrate treating apparatus includes an indexer, a processor, and an interface. The indexer takes a substrate from a carrier accommodating a plurality of substrates to the processor, and accommodates the substrate from the processor to the carrier. The processor performs treatment such as a resist coating, a developing process, and a heat treatment. Then the interface delivers and receives the substrate to and from an external exposing machine.

The exposing machine is disposed adjacent to the interface of the substrate treating apparatus. The exposing machine adopts an exposure technique with an immersion method (hereinunder, referred to as an "immersion exposure technique") for achieving more minute exposure patterns in recent years. In the immersion method, a liquid is charged between a projection optical system of an exposing machine and a substrate for exposure. However, in the immersion exposure technique, the exposure is performed with the substrate contacting the liquid. Accordingly, the substrate is transported from the exposing machine with the liquid (immersion liquid) adheres on the substrate subjected to the exposure. Consequently, the liquid adhering on the substrate transported from the exposing machine drops off within the substrate treating apparatus. This may cause operation failure of the substrate treating apparatus or a decreased degree of cleanness in the substrate treating apparatus.

Then, Japanese Unexamined Patent Publications No. 2008-028226A and 2009-071026A each suggest the feature that a cleaning/drying unit is disposed within the interface for performing cleaning and drying treatments to a substrate to remove a liquid adhering on the substrate. Moreover, Japanese Unexamined Patent Publication No. 2012-222237A discloses a treating method of cleaning and drying a substrate, provided that this publication has no disclosure about the use of the method for the purpose mentioned above. The substrate treating methods as mentioned above are to be described in turn.

The following describes the substrate treating method in Japanese Patent Publication No. 2008-028226A. A substrate W held on and rotated by a spin chuck is cleaned with a cleaning liquid, and the cleaning liquid is rinsed off with the rinse liquid. Then, a rinse liquid layer (puddle) L is formed on an entire surface of the substrate W. Then, the rinse liquid stops discharging, and the nozzle (liquid supply nozzle) is brought into retraction. Then, a rotation speed of the substrate W is increased, whereby the substrate W becomes thick at a periphery edge of the substrate W and becomes thin at the center of the substrate W (see FIG. 1A). At this time, the center and the periphery of the liquid layer L are under a tensioned state.

Then, an inactive gas supply nozzle 284 is moved above the center of the substrate W, and discharges inactive gas to a portion of the liquid layer L with a small thickness, whereby a hole H is formed at the center of the substrate W (see FIG. 1B). This eliminates the tensioned state, and the liquid layer L is integrally moved toward outside of the substrate W by a centrifugal force with a kept ring boundary between the hole H and the liquid layer L (see FIG. 1C). Consequently, the substrate W can be dried with retrained formation of minute droplets of the layered rinse liquid on the substrate W.

The following describes the substrate treating method in Japanese Unexamined Patent Publication No. 2009-071026A. A substrate W held on and rotated by a spin chuck is cleaned with a cleaning liquid, and the cleaning liquid is rinsed with a rinse liquid. Then, a rotation speed of the substrate W is increased while a nozzle 283 above the center of the substrate W discharges the rinse liquid to form a liquid layer L of the rinse liquid on an entire surface of the substrate W (see FIG. 2A). Then, the nozzle 283 is moved outwardly from above the center of the substrate W. At this time, the thickness at the center of the liquid layer L is reduced by a centrifugal force caused by the rotation of the substrate W. Such a region having a small thickness is hereinafter referred to as a thin layer region.

The liquid supply nozzle 283 stops moving temporarily at the position spaced away from above the center of the substrate W by a given distance. In this time period, the liquid layer L is divided within the thin layer region by a centrifugal force, so that a hole (a drying core C) is formed at the center of the liquid layer L (see FIG. 2B). After the hole H is formed, the liquid supply nozzle 283 moves outward again. Correspondingly, a centrifugal force causes a dried region (hole H) where no rinse liquid exists to spread on the substrate W with the hole H as a starting point by (see FIG. 2C). Thereafter, the nozzle 283 stops discharging the rinse liquid when the nozzle 283 is moved to reach above the periphery of the substrate W. Then the nozzle 283 moves toward outside the substrate W. This causes the hole H to spread over the whole substrate W with the liquid layer L of the rinse liquid maintained uniformly, causing the substrate W to be dried while formation of the minute droplets is prevented.

The following describes the substrate treating method in Japanese Unexamined Patent Publication No. 2012-222237A. A substrate held on and rotated by a spin chuck (wafer holding and rotating unit) is processed with a cleaning liquid, and the cleaning liquid is rinsed with deionized water. Such rinse is performed by forming a liquid layer (liquid film) on an entire surface of a substrate. Thereafter, a rotation speed of the substrate is decreased, and a nozzle (outlet) above the center of the substrate supplies a low flow rate of deionized water. At this time, the liquid layer formed on the entire surface of the substrate is not maintained but is broken. The deionized water supplied onto the substrate W flows locally from the center of the substrate to the periphery thereof in a streak shape (or in a stream shape). Then, the nozzle is moved toward the periphery of the wafer W while supplying the deionized water. At this time, the nozzle is moved while minute water drops are absorbed into the streak-shaped flow of the deionized water, the minute water drops remaining on the surface of the substrate after the liquid layer formed on the entire surface of the wafer W is broken. When the nozzle is moved toward outside the periphery of the substrate, the streak-shaped flow of the deionized water disappears from the surface of the substrate, and the surface of the wafer W is dried.

SUMMARY OF INVENTION

Technical Problem

However, the currently-used substrate cleaning/drying process possesses three drawbacks. The first drawback is as under. That is, surface repellency of a photosensitive film and its protective film used for pattern formation has been increased more and more. This causes difficulty in formation of the liquid layer L on the entire surface of the substrate. That is because a liquid between a projection optical system and the substrate has to be moved at high speeds in association with high-speed moving of the projection optical system relative to the substrate for enhancing throughput of an exposing machine with an immersion method. Consequently, time for liquid layer formation may be increased, or liquid layer formation itself may become impossible.

The second drawback is as under. That is, a bubble BB in the liquid layer L may cause liquid residue. For instance, as illustrated in FIG. 1A, if a bubble BB exists in the liquid layer L outside the center of the substrate W, a hole may be formed starting from the bubble BB. For instance, if spread of the hole around the bubble BB intersect spread of the hole H formed at the center of the substrate W, minute water droplets are generated. Influences of a centrifugal force decreases with the minute water droplets have a small size and are located close to the center of the substrate. This causes difficulty in scattering the water droplets toward outside the substrate W. Here, a rinse liquid is degassed, and the bubble BB is rarely mixed for some reason.

The third drawback is as under. That is, if a nozzle (outlet) above the center of the substrate discharges deionized water and is moved outside the substrate while discharging the deionized water as in Japanese Unexamined Patent Publication No. 2012-222237A, liquid residue may occur. Specifically, the deionized water discharged toward the center of the substrate flows in various directions. When the nozzle is moved to the outer periphery of the substrate under such a state above, the deionized water flows also in an opposite direction to the moving direction of the nozzle. The deionized water flowing in the direction opposite to the moving direction of the nozzle may result in the minute water droplets remaining around the center of the substrate. As noted above, the smaller minute water droplets remaining on the substrate close to the center of the substrate has a lower centrifugal force. Accordingly, it becomes difficult to scatter the minute water droplets outside the substrate. Consequently, the minute water droplets should be considered that are generated upon movement of the deionized water, discharged to the center of the substrate, to the outer periphery of the substrate.

The present invention has been made regarding the state of the art noted above, and its one object is to provide a substrate treating method that allows cleaning and drying of a substrate with lows liquid residue.

Solution to Problem

The present invention is constituted as stated below to achieve the above object. One embodiment of the present invention discloses a substrate treating method of treating a substrate. The method includes holding and rotating a substrate using a rotation holder, the substrate having a water-repellent film being formed on a surface thereof; starting discharging a processing liquid through a nozzle to a position spaced away from the center of the substrate by a preset distance along a surface of the substrate, and flowing the processing liquid on the substrate so as for the processing liquid to converge into one stream immediately after the starting discharging the processing liquid; and moving the nozzle toward outside the substrate while discharging the processing liquid through the nozzle successively.

With the substrate treating method according to the embodiment of the present invention, the nozzle starts discharging the processing liquid while the rotation holder holds and rotates the substrate having the water-repellent film being formed on the surface thereof. If the processing liquid flows separately, minute water droplets are likely to occur upon the separation. However, the processing liquid is discharged to the position spaced away from the center of the substrate by a preset distance, and flows so as to converge into one stream on the substrate immediately after discharge of the processing liquid starts. This achieves suppression of the minute water droplets. Moreover, the nozzle is moved toward outside the substrate while discharging the processing liquid successively. This allows the entire flow of the processing liquid to move toward outside of the substrate while the processing liquid converging into one stream on the substrate is maintained. Here, inside the flow of the processing liquid is a dried region. Consequently, the substrate can be cleaned and dried with suppressed liquid residue.

As in Japanese Unexamined Patent Publication No. 2012-222237A, liquid residue may occur when the nozzle is moved to the outer periphery of the substrate while the nozzle above the center of the substrate supplies deionized water. Specifically, the deionized water discharged toward the center of the substrate flows in various directions. Then, the nozzle is moved to the outer periphery of the substrate, and accordingly, deionized water flowing in an opposite direction to the nozzle moving direction is separated from a main stream of the deionized water discharged from the nozzle in sequence. Upon the separation, the minute water droplets are likely to be generated. That is, when all the deionized water discharged from the nozzle converges into one stream, generation of the minute water droplets can be suppressed. However, upon the nozzle movement from above the center of the substrate, the deionized water is separated to cause generation of the minute water droplets. The minute water droplets remaining around the center of the substrate are not absorbed into the main stream of the deionized water that is formed by discharging the deionized water from the nozzle in sequence. In addition, the minute water droplets are likely to be insulated from the influence of the centrifugal force. Consequently, the minute water droplets may cause liquid residue. With the embodiment of the present invention, the processing liquid flows on the substrate immediately after discharge of the processing liquid starts so as for the processing liquid to converge into one stream. This allows prevention of the processing liquid from being separated upon movement of the processing liquid, discharged toward the center of the substrate, to the periphery of the substrate. Consequently, generation of the minute water droplets can be suppressed.

Moreover, the liquid layer has been conventionally formed. However, when the substrate surface with increased water repellency causes difficult formation of the liquid layer, mere formation of the liquid layer is time-consuming, and the formation for a larger substrate is more time-consuming. Consequently, time for the liquid layer formation may increase, or the liquid layer formation itself may be impossible. With the embodiment of the present invention, no liquid layer is formed on the entire substrate. This eliminates a problem upon the liquid layer formation. Moreover, the time-consuming liquid layer formation is not performed. This allows enhanced throughput. In addition, in the embodiment of the present invention, no liquid layer is formed, allowing elimination of a problem about the influence of the bubbles in the liquid layer.

Moreover, it is preferable that the substrate treating method according to the embodiment of the present invention further includes extending spread of the processing liquid having reached on the substrate to the center of the substrate temporarily after the starting discharging the processing liquid. The spread of the processing liquid having reached on the substrate can extend to the center of the substrate temporarily. Consequently, the center of the substrate can be processed with the processing liquid even when the processing liquid is discharged to a position spaced away from the center of the substrate by a preset distance.

Moreover, one preferred embodiment of the substrate treating method is to move the nozzle by pivoting the nozzle around a pre-set position outside the substrate. The nozzle is pivoted around the pre-set position outside the substrate. This allows the movement of the processing liquid flow entirely outside the substrate while the processing liquid converging into one stream on the substrate is maintained.

Moreover, one preferred embodiment of the substrate treating method is to move the nozzle linearly in a radial direction of the substrate. The nozzle is moved linearly in the radial direction of the substrate. This allows the movement of the processing liquid flow entirely outside the substrate while the processing liquid converging into one stream on the substrate is maintained.

Moreover, in one preferred embodiment of the substrate treating method, the processing liquid is a cleaning liquid with no rinse. This achieves reduction in processing time.

Moreover, in one preferred embodiment of the substrate treating method, the substrate is an uncleaned substrate subjected to exposure with an immersion method. Here, an immersion liquid upon the exposure with the immersion method remains on the uncleaned substrate subjected to the exposure with the immersion method. Cleaning and drying with suppressed liquid residue can be performed to such a substrate.

Advantageous Effects of Invention

With the substrate treating method according to the embodiment of the present invention, the nozzle starts discharging the processing liquid while the rotation holder holds and rotates the substrate having the water-repellent film being formed on the surface thereof. If the processing liquid flows on the substrate separately, minute water droplets are likely to occur upon the separation. However, the processing liquid is discharged to the position spaced away from the center of the substrate by a preset distance, and flows so as to converge into one stream on the substrate immediately after discharge of the processing liquid starts. This achieves suppression of the minute water droplets. Moreover, the nozzle is moved toward outside of the substrate while discharging the processing liquid successively. This allows the entire flow of the processing liquid to move toward outside of the substrate while the processing liquid converging into one stream on the substrate is maintained. Here, inside the flow of the processing liquid is a dried region. Consequently, the substrate can be cleaned and dried with suppressed liquid residue.

BRIEF DESCRIPTION OF DRAWINGS

For the purpose of illustrating the invention, there are shown in the drawings several forms which are presently preferred, it being understood, however, that the invention is not limited to the precise arrangement and instrumentalities shown.

FIGS. 1A to 1F each illustrate a currently-used substrate treating method.

FIG. 6 is a schematic left side view of the substrate treating apparatus according to the embodiment.

FIG. 10 illustrates evaluation results of water droplets with a variation in distance between the center of a substrate and the nozzle.

FIG. 11 illustrates evaluation results of water droplets with a variation in number of rotations of the substrate.

FIG. 12 illustrates evaluation results of water droplets with a variation in flow rate of the processing liquid.

FIG. 13 illustrates evaluation results of water droplets containing estimations for the variation in distance between the center of the substrate and the nozzle and for the variation in flow rate of the processing liquid.

Embodiment 1

Figure 2A:
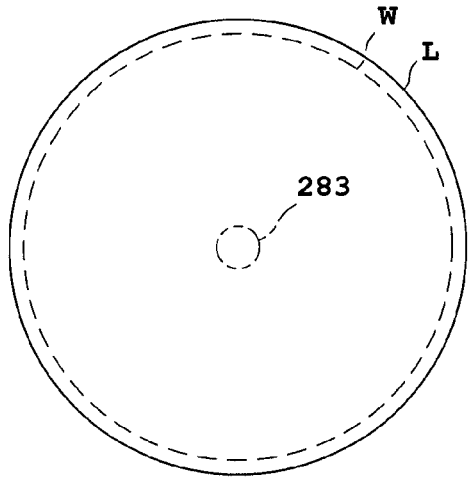
FIGS. 2A to 2F each illustrate a currently-used substrate treating method.
Figure 2B:
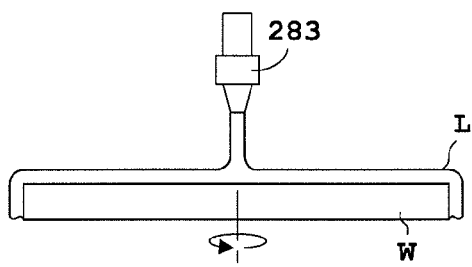
Figure 2C:
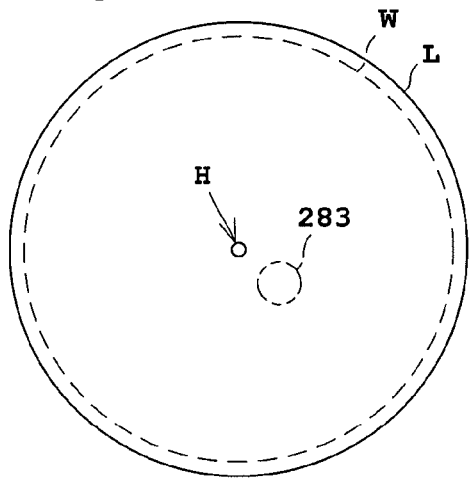
Figure 2D:
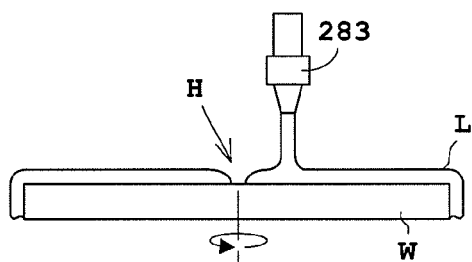
Figure 2E:
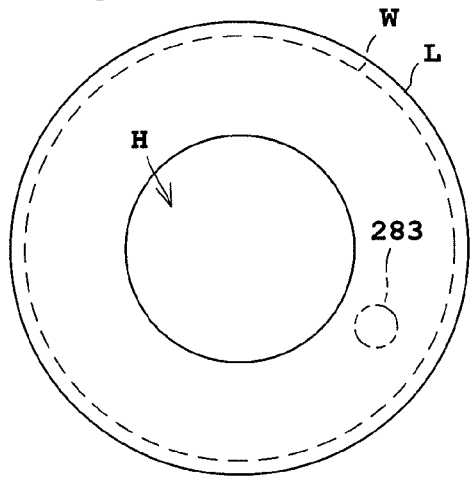
Figure 2F:
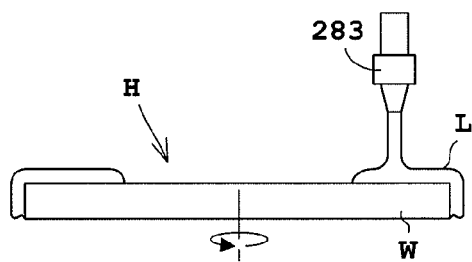
Figure 3:
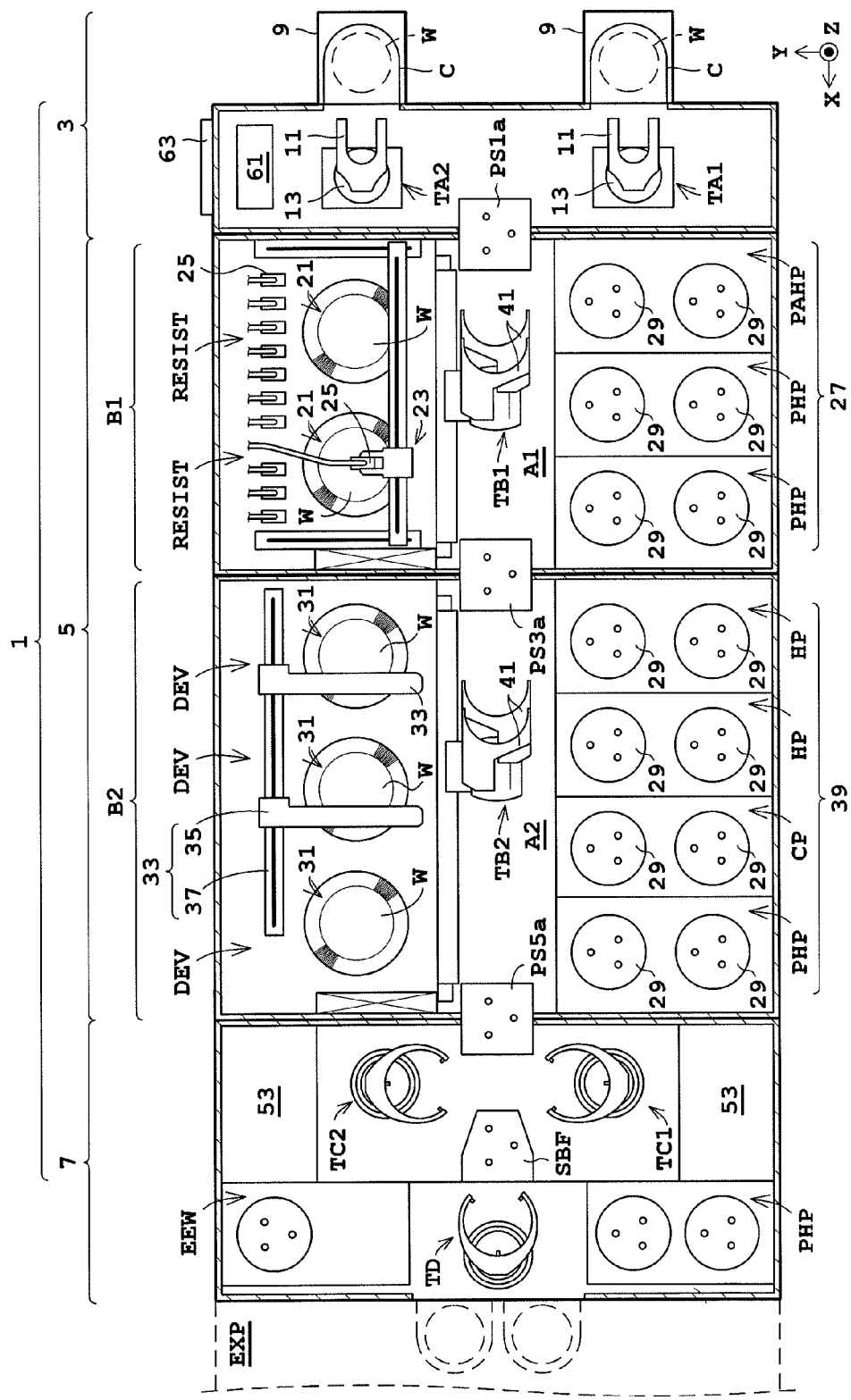
FIG. 3 is a schematic plan view of a substrate treating apparatus according to one embodiment of the present invention.
Figure 4:
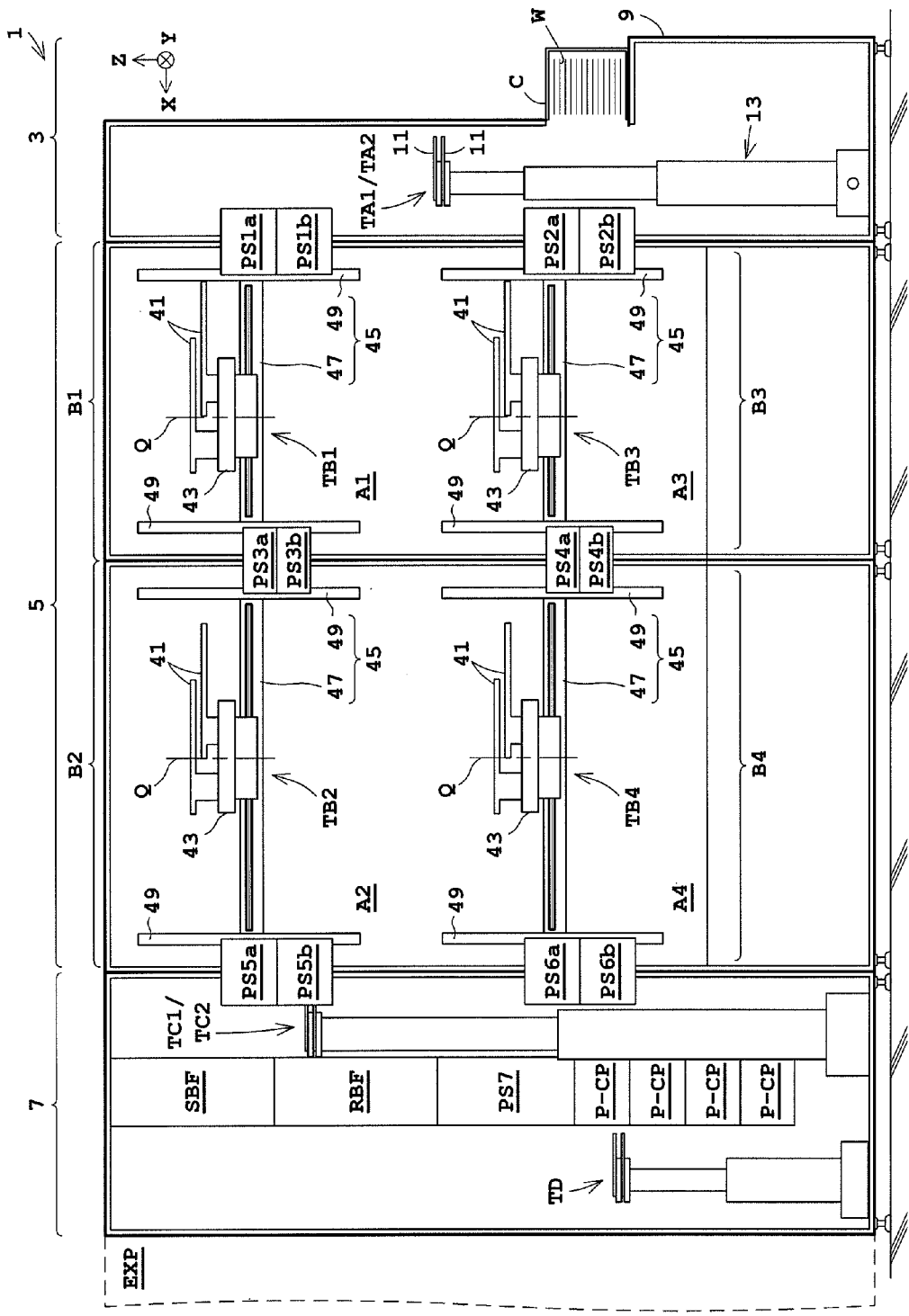
FIG. 4 is a schematic longitudinal sectional view of the substrate treating apparatus according to the embodiment.
Figure 5:
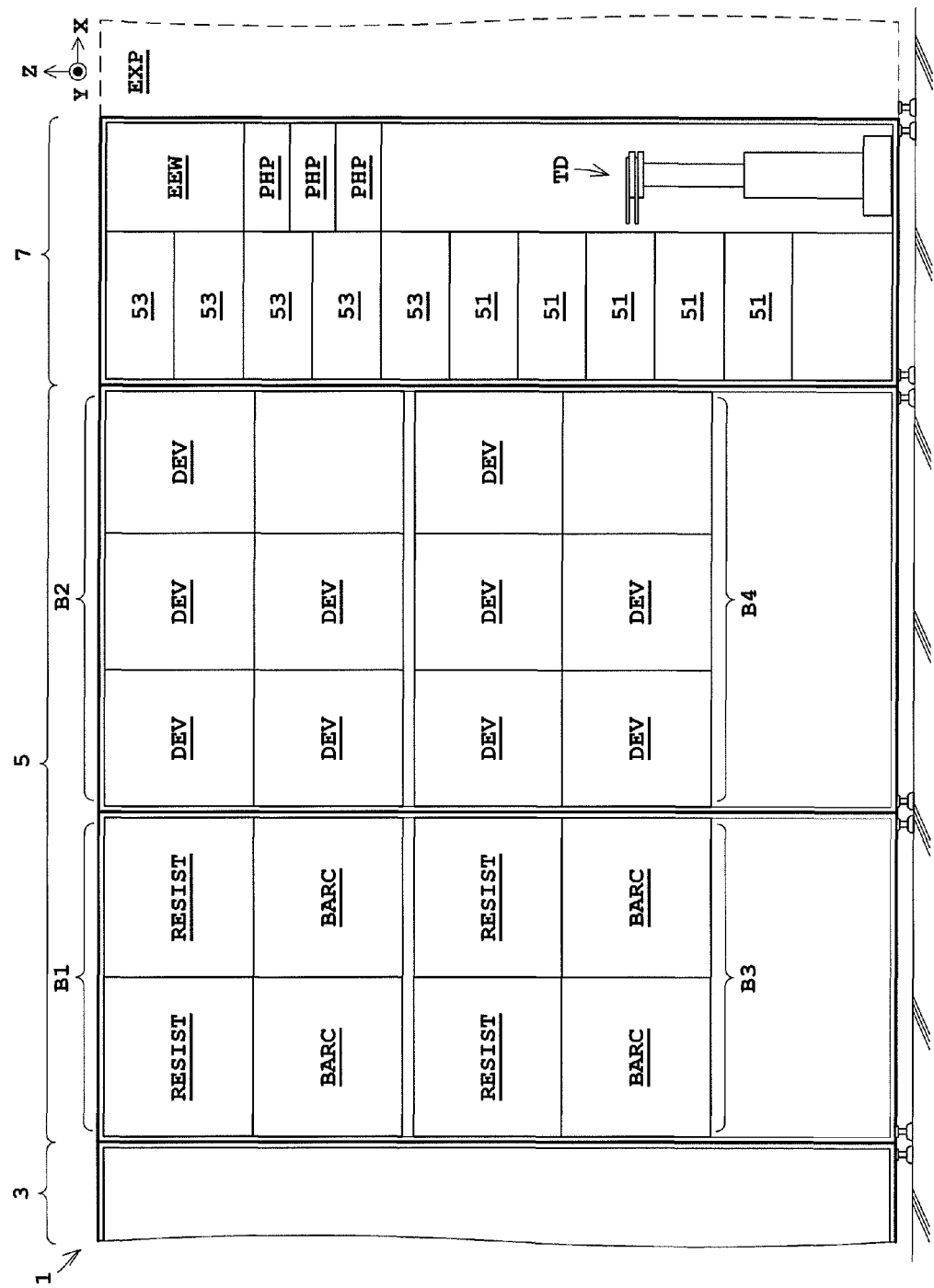
FIG. 5 is a schematic right side view of the substrate treating apparatus according to the embodiment.

The following describes Embodiment 1 of the present invention with reference to drawings. FIG. 3 is a schematic plan view of a substrate treating apparatus 1. FIG. 4 is a schematic longitudinal sectional view of the substrate treating apparatus 1. FIG. 5 is a schematic right side view of the substrate treating apparatus 1. FIG. 6 is a schematic left side view of the substrate treating apparatus 1.

Reference is made to FIG. 3. The substrate treating apparatus 1 includes an indexer (hereinafter, referred to as an "ID section") 3, a processor 5, and an interface (hereinafter, referred to as an "IF section") 7. The ID section 3, the processor 5, and the IF section 7 are provided adjacently in this order. In addition, another exposing machine EXP is provided adjacently to the IF section 7, the exposing machine EXP being separated from the substrate treating apparatus 1. The following describes each construction of the above elements in order.

[ID Section 3]

The ID section 3 includes carrier mount tables 9, and two transport mechanisms TA1 and TA2 inside the ID section (hereinafter, referred to as a "transport mechanism" as appropriate). An individual carrier mount table 9 includes a carrier C accommodating a plurality of substrates (e.g., semiconductor wafers) W. The transport mechanisms TA1 and TA2 are so-called transporting robots. The transport mechanisms TA1 and TA2 each take the substrate W from the carrier C, transports the substrate W to a mount table PS1a, receives the substrate W transported from the processor 5 to a mount table PS1b (see FIG. 4), and houses (returns) the substrate W to the carrier C. The transport mechanisms TA1 and TA2 each include one or more holding arms 11 each holding the substrate W, and a holding arm supporting table 13. The holding arm supporting table 13 moves the holding arms 11 vertically and horizontally, and turns the holding arms 11 about a vertical (Z-direction) axis.

Here in FIG. 3, two carrier mount tables 9 are provided. Alternatively, one carrier mount table 9 or three or more carrier mount tables 9 may be provided. Moreover, the two transport mechanisms TA1 and TA2 are provided. Alternatively, the number of transport mechanisms may be three or more. Alternatively, one transport mechanism may be so provided as to be movable in a width direction (Y-direction) of the substrate treating apparatus 1. Moreover, a FOUP (front opening unified pod) is illustrated as one example of the carrier C. Another type is applicable to the carrier C.

[Processor 5]

The processor 5 is formed by four processing blocks B1 to B4 as illustrated in FIG. 4. The processing blocks B1 to B4 each include one or more processing units U denoted by numerals PHP, CP, HP, RESIST, and DEV as illustrated in FIG. 3, and an individual main transport mechanisms TB1 to TB4, respectively. Moreover, the processing blocks B1 to B4 include transportation spaces A1 to A4, respectively, for transporting the substrate W with the main transport mechanisms TB1 to TB4, respectively. The transportation spaces A1 to A4 are each elongated in an X-direction. Moreover, processing units U in FIG. 5 and FIG. 6 are provided on both ends of each of the transportation spaces A1 to A4.

<Processing Block B1 and B3>

As illustrated in FIG. 5, the processing blocks B1 and B3 each include antireflection-film application processing units BARC each forming an antireflection film on the substrate W, and resist-film application processing units RESIST each forming a resist film on the substrate W. In the processing blocks B1 and B3, the application processing units BARC and RESIST are each arranged in 2 by 2, i.e., two in the horizontal direction and two in the vertical direction.

As illustrated in FIG. 3, the application processing units BARC and RESIST each include a rotation holder 21 rotatably holding the substrate W, and a coating liquid feeder 23 feeding a coating liquid (e.g., a resist liquid) to the substrate W. The coating liquid feeder 23 selects one of a plurality of coating nozzle 25. The coating liquid feeder 23 is movable between a standby position of the coating nozzle 25 and a coating position above the substrate W.

Moreover, the two processing blocks B1 and B3 further include heat treating units 27, respectively, each performing a heat treatment to the substrate W. As illustrated in FIG. 6, the heat treating units 27 each include cooling units CP cooling the substrate W, heating-cooling units PHP heating and cooling the substrate W successively, and adhesion reinforcement processing units PAHP. The adhesion reinforcement processing units PAHP each apply an adhesion reinforcement agent, such as hexamethyldisilazane (HMDS), to the substrate W and thereafter heating the substrate W, thereby enhancing adhesion between the substrate W and the antireflection film. The heat treating units 27 are arranged in 3 by 5, i.e., three in the horizontal direction and five in the vertical direction. Moreover, the heat treating units 27 each include a plate 29 placing the substrate W thereon as illustrated in FIG. 3.

<Processing Block B2 and B4>

As illustrated in FIG. 5, the two processing blocks B2 and B4 each include developing units DEV developing the substrate W. The processing blocks B2 and B4 are each configured so as for the developing process units DEV thereof to be arranged in 3 by 2, i.e., three in the horizontal direction and two in the vertical direction. As illustrated in FIG. 3, the developing process units DEV each further include a rotation holder 31 rotatably holding the substrate W and a processing liquid feeder 33 feeding a developer. The processing liquid feeder 33 includes a nozzle 35 discharging the developer, and a guide rail 37 holding the nozzle 35 movably in the X-direction.

The two processing blocks B2 and B4 each further include a heat treating unit 39 for performing a heat treatment to the substrate W. As illustrated in FIG. 6, the heat treating units 39 each include heating units HP heating the substrate W, cooling units CP cooling the substrate W, and heating-cooling units PHP. The heat treating units 39 are arranged in 4 by 5, i.e., four in the horizontal direction and five in the vertical direction.

Here, the type, the number, and arrangement of various processing units U in the processing blocks B1 and B4 are not limited to those in FIGS. 5 and 6, but are set as appropriate.

<Substrate Transportation Between ID Section 3 and IF Section 7>

The following describes substrate transportation between the ID section 3 and the IF section 7. The substrate is transported through mount tables PS1a to PS6a, and PS1b to PS6b by the main transport mechanisms TB1 to TB4. As illustrated in FIG. 4, the main transport mechanism TB1 to TB4 each include two holding arms 41 holding the substrate W, an arm holding table 43 moving the holding arms 41 horizontally and changing directions of the holding arms 41 around an axis Q, and an arm holding table moving unit 45 moving the arm holding table 43 two-dimensionally (X- and Z-directions). The arm holding table moving unit 45 includes a guide rail 47 movably supporting the arm holding table 43 in the X-direction, and a guide rail 49 movably supporting the arm holding table 43 in the Z-direction.

Consequently, the main transport mechanism TB1 allows either transfer or receipt of the substrate W to or from the processing units U of the processing block B1 and four mount tables PS1a, PS1b, PS3a, and PS3b. The same applies to the main transport mechanisms TB2 to TB4.

Moreover, the processing blocks B1 and B2 except for the processing unit U each transport the substrate as under. When the substrate is transported from the ID section 3 to the IF section 7, the substrate W is transported to the mount tables PS1a, PS3a, and PS5a in this order. In contrast to this, when the substrate is transported from the IF section 7 to the ID section 3, the substrate W is transported to the mount tables PS5b, PS3b, and PS1b, in this order. On the other hand, the processing blocks B3 and B4 except for the processing unit U each transport the substrate as under. When the substrate is transported from the ID section 3 to the IF section 7, the substrate W is transported to the mount tables PS2a, PS4a, and PS6a, in this order. In contrast to this, when the substrate is transported from the IF section 7 to the ID section 3, the substrate W is transported to the mount tables PS6b, PS4b, and PS2b, in this order.

[IF Section 7]

The IF section 7 transports the substrate W from the processor 5 to an exposing machine EXP as an external apparatus. Moreover, the IF section 7 returns the substrate W exposed by the exposing machine EXP to the processor 5. The IF section 7 includes a first transport mechanism adjacent to the processor (hereinafter, referred to as a "transport mechanism" as appropriate) TC1, a second transport mechanism adjacent to the processor (hereinafter, referred to as a "transport mechanism" as appropriate) TC2, and a single transport mechanism adjacent to the exposing machine (hereinafter, referred to as a "transport mechanism" as appropriate) TD, as illustrated in FIG. 3. The transport mechanisms TC1, TC2, and TD are configured in the same manner as the transport mechanisms TA1 and TA2, and accordingly, the description thereof is to be omitted.

The IF section 7 further includes a mounting-cum-cooling unit P-CP with a cooling function, a mount table PS7, a feed buffer SBF, and a return buffer RBF. Moreover, the IF section further includes the processing unit U. The processing unit U includes an edge exposure unit EEW exposing a periphery of the substrate W, a heating-cooling unit PHP performing heating and cooling successively, a pre-exposure cleaning/drying unit 51 performing cleaning and drying the substrate W prior to the exposure, and a post-exposure cleaning/drying unit 53 cleaning and drying the substrate W subjected to the exposure. See FIGS. 3 to 6.

The edge exposure unit EEW includes a rotation holder (not shown) rotatably holding the substrate W, and a light irradiator (not shown) exposing the periphery of the substrate W held with the rotation holder. The heating-cooling unit PHP performs heating to the exposed substrate W after exposure (PEB: Post Exposure Bake). The cleaning/drying units 51 and 53 are to be mentioned later in detail.

The mounting-cum-cooling units P-CP, the mount table PS7, the feed buffer SBF, and the return buffer RBF are each so configured as to place one or more substrates W. Moreover, one or more edge exposure units EEW, heating-cooling units PHP, pre-exposure cleaning units 21, and post-exposure cleaning units 23 are provided. Moreover, the edge exposure unit EEW may be provided in the two processing blocks B2 and B4 of the processor 5 individually. The types, the numbers, and arrangement of the processing unit U are not limited to those in FIGS. 3 to 6, and are set as appropriate.

The two transport mechanisms TC1 and TC2 each transfer and receive the substrate W to and from the mount tables PS5a, PS5b, PS6a, and PS6b, the edge exposure unit EEW, the mounting-cum-cooling units P-CP, the mount table PS7 and heating/cooling units PHP, the feed buffer SBF, and the return buffer RBF. The transport mechanism TD transfers and receives the substrate W to and from the mounting-cum-cooling units P-CP, the exposing machine EXP, and the mount table PS7.

[Construction of Control System]

The substrate treating apparatus 1 includes a main controller 61 and an input/output unit 63. For instance, as illustrated in FIG. 3, the main controller 61 and the input/output unit 63 are arranged in the ID section 3. The main controller 61 controls en bloc each element of the ID section 3, the processor 5, and the IF section 7. The main controller 31 includes a CPU. Specifically, the main controller 61 controls each operation of the transport mechanisms TB1 to TB4 and various processing units U.

The input/output unit 63 is attached on a side wall of the ID section 3. The input/output unit 63 displays transportation conditions and processing conditions of the substrates W in the substrate treating apparatus 1. Moreover, a user allows input of commands into the input/output unit 63, the commands concerning display on the input/output unit 63 and concerning operation of the transport mechanisms TB1 to TB4 as well as the processing units U.

[Operation of Substrate Treating Apparatus 1]

The following describes operation of the substrate treating apparatus 1 with reference to FIGS. 3 to 6. Here, in the processor 5, the two processing blocks B1 and B2 each perform the same series of processes as the two processing blocks B3 and B4 simultaneously. Accordingly, the processor 5 is to be described taking the two processing blocks B1 and B2 as the representative thereof.

The transport mechanism TA1 of the ID section 3 receives a substrate W from the carrier C transported to the carrier mount table 9 by the user, and transports the received substrate W to the mount table PS1a. In the processing block B1, the main transport mechanism TB1 transports the substrate W to the cooling unit CP, the application processing unit BARC, the heating/cooling unit PHP, the cooling unit CP, the application processing unit RESIST, the heating/cooling unit PHP, and the cooling unit CP, in this order, for performing various processes. Then the substrate W subjected to all the processes are transported to the mount table PS3a. The substrate W transported onto the mount table PS3a is further transported to the mount table PS5a with the main transport mechanism TB2 in the processing block B2. In the application processing unit RESIST, a resist is applied to form a water-repellent resist film containing fluorine. Moreover, the substrate W may be transported to the adhesion reinforcement processing unit PAHP for achieving adhesion between the substrate W and the antireflection film.

The substrate W transported onto the mount table PS5a is transported to the edge exposure unit EEW, the pre-exposure cleaning/drying unit 51, the mounting-cum-cooling unit P-CP, in this order, with the transport mechanisms TC1 and TC2 in the IF section 7 for performing various processes. In the IF section 7, if the substrate W prior to the exposure is not allowed to be transported to the mounting-cum-cooling unit P-CP, the substrate W is temporarily stored in the feed buffer SBF. The substrate W transported onto the mounting-cum-cooling unit P-CP is transported to the exposing machine EXP with the transport mechanism TD in the IF section 7.

In the exposing machine EXP, the exposure with an immersion method is performed. The exposed substrate W is transported to the mount table PS7 with the transport mechanism TD in the IF section 7. The substrate W transported onto the mount table PS7 is transported to the post-exposure cleaning/drying unit 53, the heating/cooling unit PHP, and the mount table PS5b, in this order, with the transport mechanisms TC1 and TC2 in the IF section 7 for performing given processes. If the exposed substrate W is not allowed to be transported to the heating/cooling unit PHP in the IF section 7, the substrate W is temporarily stored in the return buffer RBF. Here, an uncleaned substrate W subjected to the exposure with the immersion method, i.e., a substrate W having an immersion liquid remaining thereon upon the exposure with the immersion method is transported to the exposed cleaning/drying unit 53. The cleaning/drying unit 53 allows cleaning and drying of the substrate W with no liquid residue.

The substrate W transported onto the mount table PS5b is transported to the cooling unit CP, the developing process unit DEV, the heating unit HP, the cooling unit CP, and the mount table PS3b, in this order, with the main transport mechanism TB2 in the processing block B2 for performing given processes. The substrate W transported onto the mount table PS3b is further transported to the mount table PS1b with the main transport mechanism TB1 in the processing block B1. The substrate W transported onto the mount table PS1b is returned to its original carrier C of the carrier mount table 9 with the transport mechanism TA1, for example, in the ID section 3. All the substrates W are returned to the carrier C, and the user transports the carrier C to another apparatus.

[Cleaning/Drying Unit 51, 53]

Figure 7A:
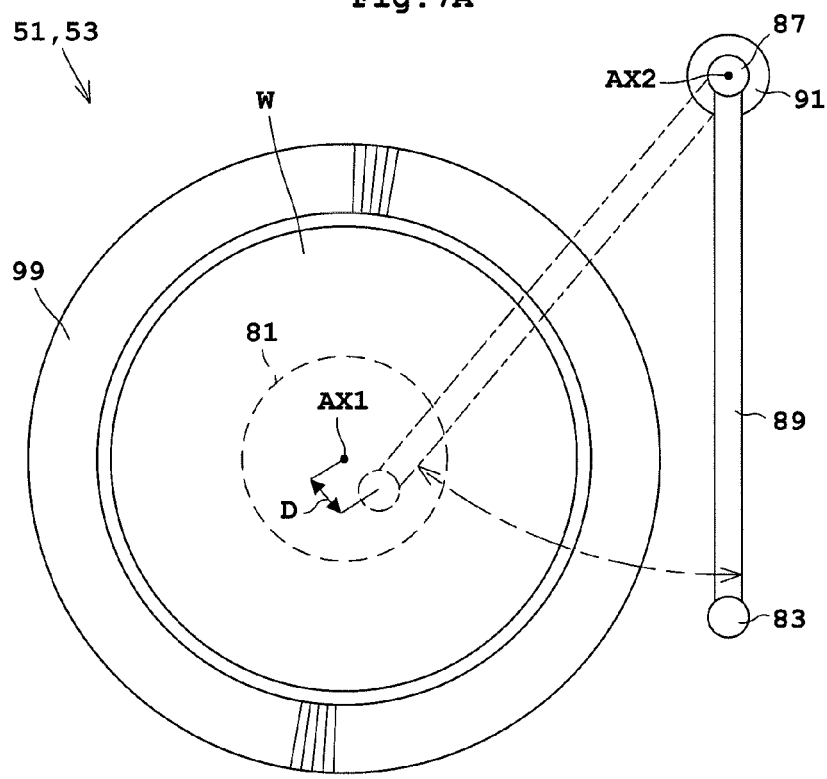
FIG. 7A is a schematic plan view of a cleaning/drying unit according to the embodiment.
Figure 7B:
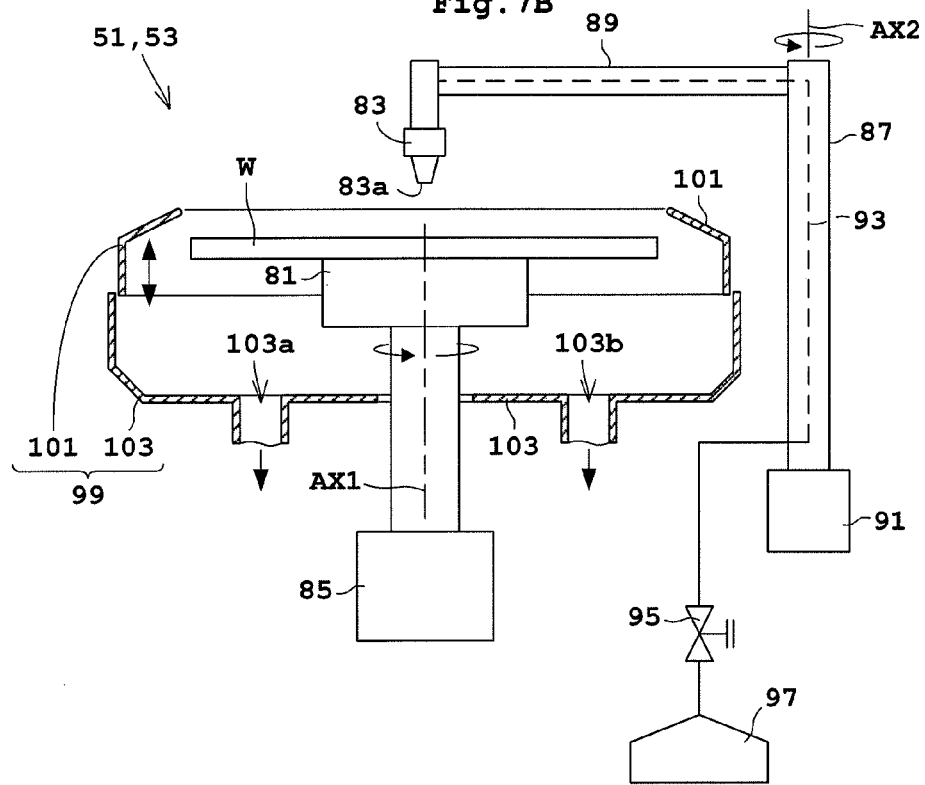
FIG. 7B is a schematic longitudinal sectional view of the cleaning/drying unit according to the embodiment.

The following describes the cleaning/drying units 51 and 53 in detail. FIG. 7A is a schematic plan view of the cleaning/drying units 51 and 53. FIG. 7B is a schematic longitudinal sectional view of the cleaning/drying units 51 and 53. The cleaning/drying units 51 and 53 each include a spin chuck 81 holding the substrate W horizontally and rotating the held substrate W, and a nozzle (or referred to as a "liquid supplying nozzle") 83 discharging a processing liquid PL onto a surface of the substrate W held with the spin chuck 81.

The spin chuck 81 rotates the substrate W around a vertical axis AX1 through the center of the substrate W. That is, the center of the substrate W conforms to the rotational central axis AX1 of the substrate W. Accordingly, the center of the substrate W is denoted by the numeral AX1. Moreover, the spin chuck 81 has a suction path formed therein, not shown, through which air is exhausted to perform vacuum suction and hold a rear face of the substrate W. The spin chuck 81 is rotated by a chuck rotating mechanism 85 such as a motor. Here, the spin chuck 81 and the chuck rotating mechanism 85 correspond to the rotation holder in the present invention.

A nozzle rotating shaft 87 is provided at a preset position outside the substrate W held with the spin chuck 81. The nozzle rotating shaft 87 is rotatably held around an axis AX2. The nozzle 83 and the nozzle rotating shaft 87 are connected via a rod nozzle arm 89. A nozzle moving mechanism 91 such as a motor pivots the nozzle rotating shaft 87. This causes the nozzle 83 to be pivoted around the axis AX2 located at the preset position outside the substrate W, allowing the nozzle 83 above the substrate W to be moved toward outside the substrate W. For instance, the nozzle 83 is movable bi-directionally between the above of the center AX1 of the substrate W and a given retracting position outside the substrate W.

The nozzle rotating shaft 87 and the nozzle arm 89 are provided with a processing liquid supplying pipe 93 supplying the processing liquid PL to the nozzle 83. The processing liquid supplying pipe 93 is connected to a processing liquid supplying source 97 via a valve 95. The valve 95 controls opening and closing to allow adjustment of a feed rate of the processing liquid PL. Here, deionized water (pure water) is used as one example of the processing liquid PL. The substrate W held with the spin chuck 81 is accommodated into a cup 99. The cup 99 includes an upper cup 101 movable vertically and a lower cup 103. The lower cup 103 includes a liquid discharge outlet 103*a* and an exhaust port 103*b*. The liquid discharge outlet 103*a* collects the processing liquid PL scattered from the substrate W. The exhaust port 103*b* exhausts air.

The following describes operation of the cleaning/drying units 51 and 53. FIGS. 8A to 8F and FIGS. 9A to 9F each illustrate processes of cleaning and drying the substrate W when the nozzle 83 is pivoted. The transport mechanisms TC1 and TC2 each transport the substrate W on the spin chuck 81. After the substrate is transported, the upper cup 101 is moved upward with a lifting mechanism, not shown, to cover a side face of the substrate W. Here, the spin chuck 81 holds the substrate W. The chuck rotating mechanism 85 rotates the spin chuck 81, and correspondingly the substrate W is rotated.

After the spin chuck 81 holds the substrate W, the nozzle 83 is pivoted around the axis AX2 outside the substrate W with the nozzle moving mechanism 91 to be moved to a position where the processing liquid PL (e.g., deionized water) is discharged. The position where the processing liquid PL is discharged is a position spaced away from the center AX1 of the substrate W by a preset distance D along the surface of the substrate W.

Figure 8A:
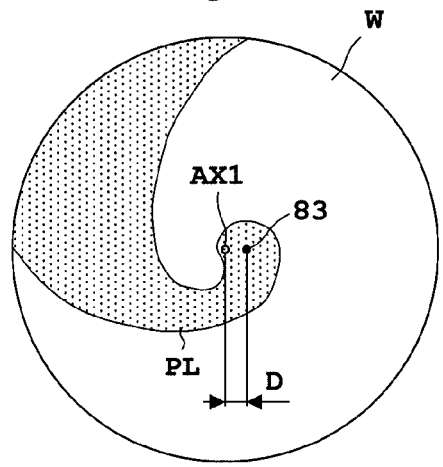
FIGS. 8A to 8F and FIGS. 9A to 9F each illustrate cleaning and drying processes when a nozzle pivots.
Figure 8B:
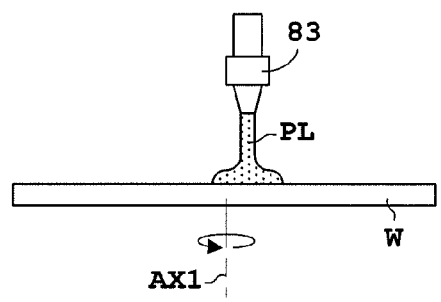

The nozzle 83 discharges the processing liquid PL onto the surface of the rotating substrate W as illustrated in FIGS. 8A and 8B. The nozzle 83 starts discharging the processing liquid PL to a position away from the center AX1 of the substrate W by a preset distance D along the surface of the substrate W. At this time, the nozzle 83 is located above the substrate W above the position away from the center AX1 of the substrate W by the preset distance D, and discharges the processing liquid PL from an outlet 83*a* thereof directed directly downward. That is, the processing liquid PL is discharged to a position away from the center AX1.

The processing liquid PL flows on the surface of the rotating substrate W having a water-repellent resist film formed thereon. Here, the processing liquid PL flows on the substrate W immediately after discharging the processing liquid PL so as to converge into one stream. That is, the processing liquid PL flows into be one strip (or streak) immediately after being discharged. Then, the processing liquid PL converging into one stream on the substrate W flows away from the periphery edge of the substrate W.

Moreover, after the processing liquid PL is discharged, spread of the processing liquid PL having reached on the substrate W temporarily extends to the center AX1 of the substrate W. A feed rate of the processing liquid PL is adjusted, for example, to achieve this. In addition, a feed rate is adjusted so as not to splash the processing liquid PL on the surface of the substrate W. As noted above, the processing liquid PL (i.e., an edge of the processing liquid PL) spreads on the surface of the rotating substrate W to reach the center AX1 of the substrate W. Consequently, the center AX1 of the substrate W can be cleaned with the processing liquid PL even when the processing liquid PL is discharged through the nozzle 83 to the position spaced away from the center AX1 of the substrate W by the preset distance D.

In addition, a processing condition is set for processing the center AX1 of the substrate with the processing liquid and for suppression of residual minute water droplets although discharging of the processing liquid PL starts to the position away from the center AX1 of the substrate W by the distance D. The processing condition is set by adjusting at least a distance of the nozzle 83 from the center AX1 (a nozzle distance D), the number of rotations of the substrate (rotation speed), exhaust pressure of the cup 99 (Pa), a size of the outlet 83*a* of the nozzle 83, a discharge rate (flow rate of the processing liquid) and discharge pressure of the processing liquid.

Figure 8C:
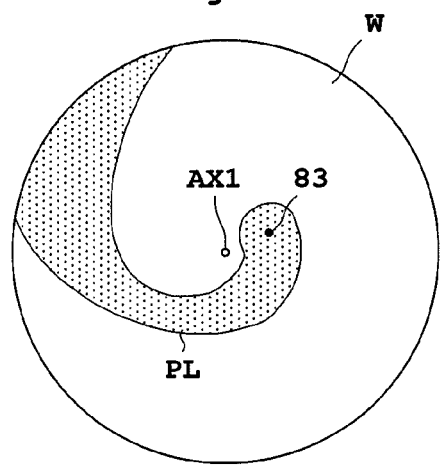
Figure 8D:
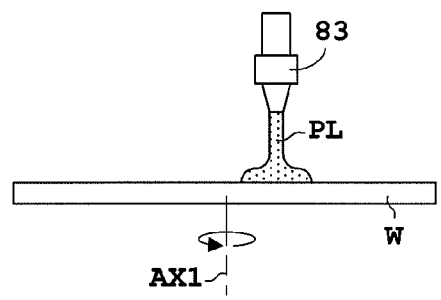
Figure 8E:
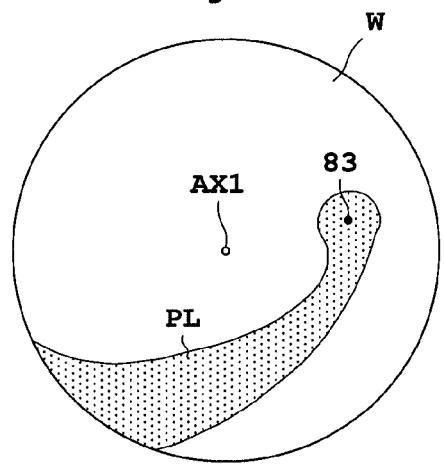
Figure 8F:
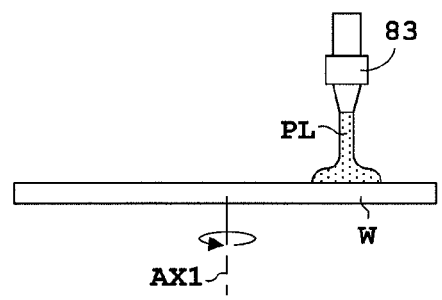
Figure 9A:
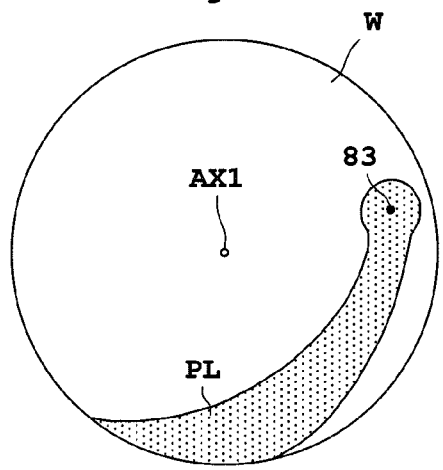
Figure 9B:
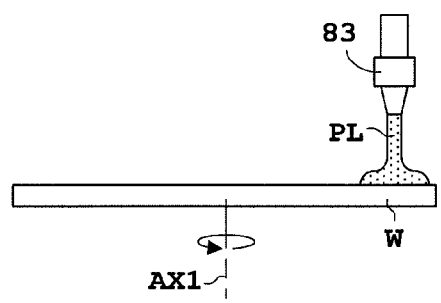
Figure 9C:
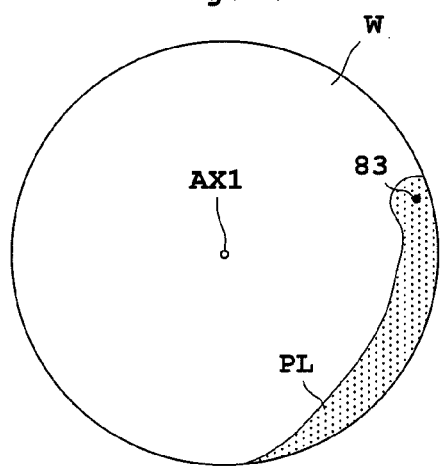
Figure 9D:
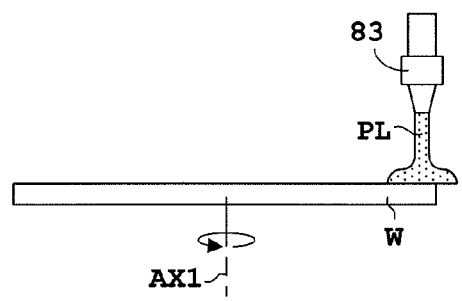
Figure 9E:
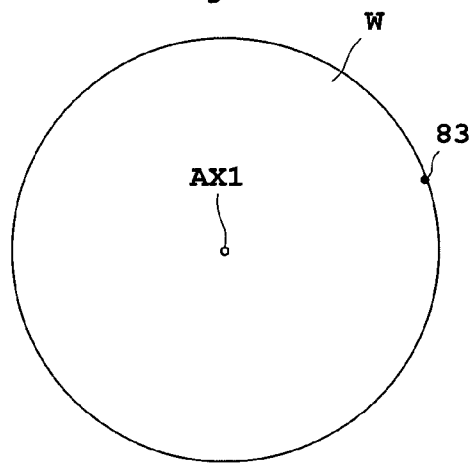
Figure 9F:
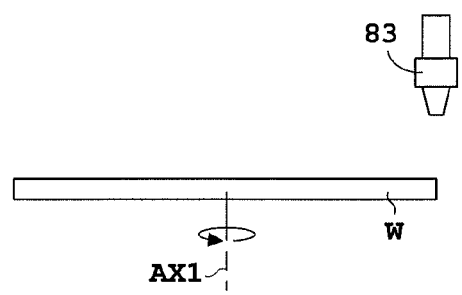

Thereafter, the nozzle 83 is moved toward outside the substrate W from the position spaced away from the center AX1 of the substrate W by the preset distance D while continuously discharging the processing liquid PL. That is, the nozzle moving mechanism 91 pivots the nozzle 83 around the axis AX2 outside the substrate W to move the nozzle toward outside the substrate W in a step manner as illustrated in FIG. 8C (FIG. 8D), FIG. 8E (FIG. 8F), FIG. 9A (FIG. 9B), FIG. 9C (FIG. 9D), and FIG. 9E (FIG. 9F), in this order. As illustrated in FIGS. 9E and 9F, when the nozzle 83 is located above the periphery edge of the substrate W, the discharge of the processing liquid PL stops. Alternatively, the discharge of the processing liquid PL may stop if the nozzle 83 is located outside the substrate W. The nozzle 83 is finally moved to its retracting position outside the substrate W.

The nozzle 83 is pivoted around the axis AX2 of the substrate W. This allows the entire flow of the processing liquid PL to move toward outside the substrate W while the processing liquid PL converging into one stream on the substrate is maintained. At this time, the nozzle 83 discharges the processing liquid PL to clean the substrate W while the substrate W is dried on a side opposite to the side where the nozzle 83 is moved. Accordingly, the processing liquid PL is kept in one stream, allowing the substrate W to be dried with no residual minute water droplet.

Here, the rotation speed of the substrate W is constant. Alternatively, the rotation speed of the substrate may be variable during movement of the nozzle 83 when the processing liquid PL is kept in one stream.

[Water Droplets Evaluation Result]

The following describes the evaluation results of the present invention with reference to FIGS. 10 to 13. In FIGS. 10 to 13, it is determined whether or not the center AX1 of the substrate is cleaned and some liquid residue exists on the substrate W with the cleaned center AX1 by changing any of a flow rate of the processing liquid PL, the nozzle distance D, and the number of rotations of the substrate.

FIG. 10 illustrates evaluation results of water droplets with a flow rate of the processing liquid of 500 ml/min and the number of rotations of the substrate of 600 rpm being fixed and a nozzle distance D of the nozzle 83 from the center AX1 being variable. FIG. 10 reveals that satisfied results were obtained that the center AX1 of the substrate was cleaned and no liquid residue exists on the substrate W with a nozzle distance D of equal to or more than 8 mm and equal to or less than 13 mm. In contrast to this, it is revealed that some liquid residue existed around the center AX1 of the substrate (containing the center AX1 of the substrate) with the small nozzle distance D (less than 8 mm). Moreover, it is revealed that the center AX1 of the substrate was not cleaned with the large nozzle distance D (i.e., more than 13 mm).

FIG. 11 illustrates evaluation results of water droplets with a flow rate of the processing liquid of 500 ml/min and a nozzle distance D of 10 mm being fixed and the number of rotations of the substrate being variable. FIG. 11 reveals that satisfied results were obtained that the substrate center AX1 was cleaned and no liquid residue existed on the substrate W at the number of rotations of the substrate of 200 rpm or more and 800 rpm or less. In contrast to this, it is revealed that some liquid residue remained around the substrate center AX1 at the number of rotations of the substrate of less than 200 rpm. Moreover, it is revealed that the substrate center AX1 was not cleaned at the number of rotations of the substrate of more than 800 rpm.

FIG. 12 illustrates evaluation results of water droplets with the number of rotations of the substrate of 600 rpm and the nozzle distance D of 10 mm being fixed and a flow rate of processing liquid being variable. FIG. 12 reveals that satisfied results were obtained that the substrate center AX1 was cleaned and no liquid residue existed on the substrate W at a flow rate of processing liquid of 300 ml/min or more and 700 ml/min or less. In contrast to this, it is revealed that some liquid residue existed around the substrate center AX1 at a high flow rate of processing liquid (more than 700 ml/min). It is also revealed that the substrate center AX1 was not cleaned at a low flow rate of processing liquid (less than 300 ml/min).

FIG. 13 illustrates evaluation results of water droplets with the number of rotations being fixed at 600 rpm and the nozzle distance D and a flow rate of processing liquid being variable containing estimation. Firstly, the following describes how to understand FIG. 13. Evaluation results in FIG. 13 denoted by uppercase characters such as "OK" and "NG" each indicate an actual evaluation result as in FIGS. 10 and 12. On the other hand, evaluation results in FIG. 13 denoted by lowercase characters such as "ok" and "ng" are estimation with no evaluation result.

Moreover, FIG. 13 contains cells with "right oblique lines" each indicating a short nozzle distance D and a high flow rate of processing liquid. In such cells, some liquid residue (minute water droplets) is likely to be generated around the substrate center AX1. In contrast to this, FIG. 13 also contains cells with "dots" each indicating a long nozzle distance D and a low flow rate of processing liquid. In such cells, the substrate center AX1 may possibly be uncleaned. Moreover, FIG. 13 also contains cells each with a "mesh". In such cells, it is estimated that a satisfied result is obtained that the substrate center AX1 is cleaned and thus no liquid residue exists on the substrate W.

With the embodiment of the present embodiment, the nozzle 83 starts discharging the processing liquid PL while the spin chuck 81 holds and rotates the substrate W having the water-repellent resist film formed on the surface thereof. If the processing liquid PL flows on the substrate W separately, minute water droplets are likely to occur upon the separation. However, the processing liquid PL is discharged to the position spaced away from the center AX1 of the substrate W by a preset distance D, and flows so as to converge into one stream on the substrate W immediately discharge of the processing liquid PL starts. This achieves suppression of the minute water droplets. Moreover, the nozzle 83 is moved toward outside the substrate W while discharging the processing liquid PL successively. This allows the entire flow of the processing liquid PL to move toward outside of the substrate W while the processing liquid PL converging into one stream on the substrate is maintained. Here, inside the flow of the processing liquid PL is a dried region. Consequently, the substrate W can be cleaned and dried with suppressed liquid residue.

As in Japanese Unexamined Patent Publication No. 2012-222237A, liquid residue may occur when the nozzle 83 is moved to the outer periphery of the substrate W while the nozzle 83 above the center AX1 of the substrate W supplies deionized water. Specifically, the deionized water discharged toward the center AX1 of the substrate W flows in various directions. Then, the nozzle 83 is moved to the outer periphery of the substrate W, and accordingly, deionized water flowing in an opposite direction to the movement direction of the nozzle 83 is separated from a main stream of the deionized water discharged from the nozzle 83 in sequence. Upon the separation, the minute water droplets are likely to be generated. That is, when all the deionized water discharged from the nozzle 83 converges into one stream, generation of the minute water droplets can be suppressed. However, upon the movement of the nozzle 83 from above the center AX1 of the substrate W, the deionized water is separated to cause generation of the minute water droplets. The minute water droplets remaining around the center AX1 of the substrate W are not absorbed into the main stream of the deionized water that is formed by discharging the deionizes water from the nozzle 83 in sequence. In addition, the minute water droplets are likely to be insulated from the influence of the centrifugal force. Consequently, the minute water droplets may cause liquid residue. With the embodiment of the present invention, the processing liquid PL flows on the substrate W immediately after discharge of the processing liquid PL starts so as for the processing liquid PL to converge into one stream. This allows prevention of the processing liquid PL from being separated upon movement of the processing liquid PL, discharged toward the center AX1 of the substrate W, to the periphery of the substrate W. Consequently, the minute water droplets can be suppressed.

Moreover, the liquid layer L has been conventionally formed. However, when the surface of the substrate W with increased water repellency causes difficult formation of the liquid layer PL, mere formation of the liquid layer PL is time-consuming, and the formation for a larger substrate W is more time-consuming. Consequently, time for the liquid layer formation may increase, or the liquid layer formation itself may be impossible. With the embodiment of the present invention, no liquid layer L is formed on the entire substrate W. This eliminates a problem upon the liquid layer formation. Moreover, the time-consuming liquid layer formation, such as discharge of the processing liquid to the center AX1 of the substrate W is not performed. This allows enhanced throughput. In addition, in the embodiment of the present invention, no liquid layer L is formed, allowing elimination of a problem about the influence of the bubbles BB in the liquid layer L.

Embodiment 2

Figure 14A:
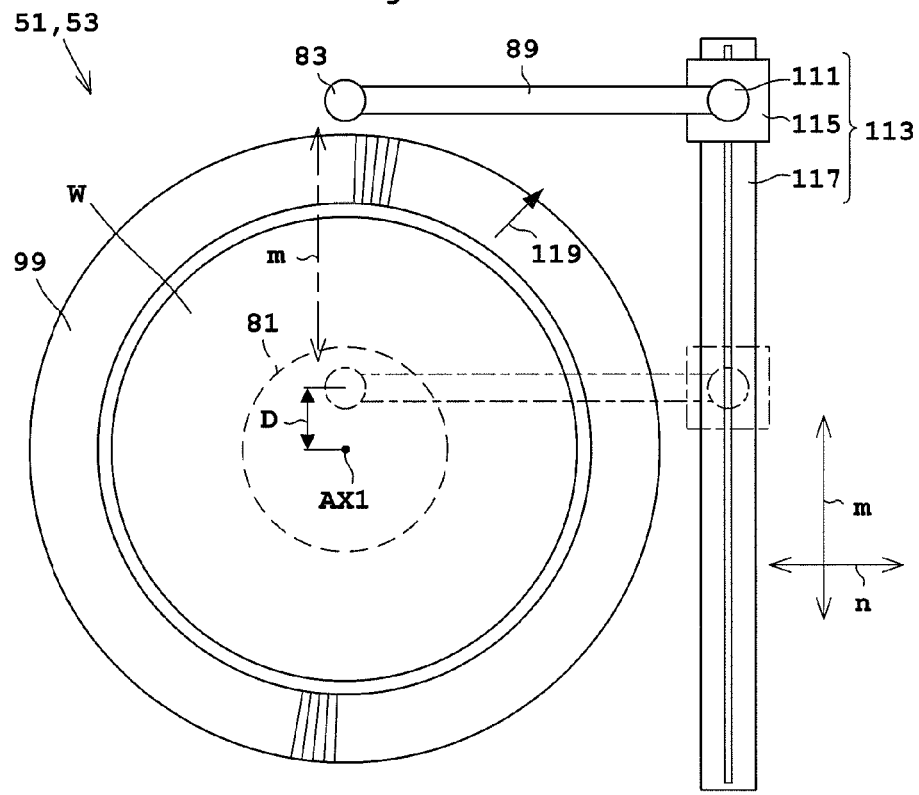
FIG. 14A is a schematic plan view of a cleaning/drying unit according to another embodiment of the present invention.
Figure 14B:
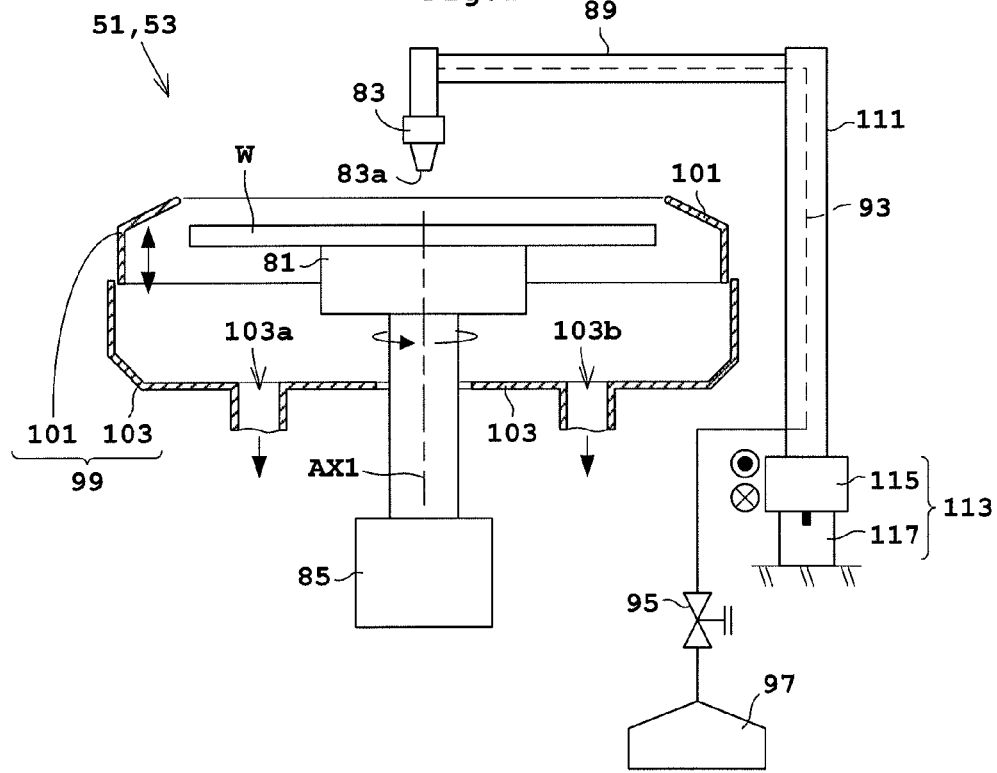
FIG. 14B is a schematic longitudinal sectional view of the cleaning/drying unit according to the other embodiment.

The following describes Embodiment 2 of the present invention with reference to the drawings. Here, the description common to that of Embodiment 1 is to be omitted. FIG. 14A is a schematic plan view of a cleaning/drying unit. FIG. 14B is a schematic longitudinal sectional view of the cleaning/drying unit. FIGS. 15A to 15F each illustrate processes of cleaning and drying a substrate when a nozzle is moved linearly.

In the cleaning/drying units 51 and 53 of Embodiment 1, the nozzle 83 is moved toward outside the substrate W by pivoting the nozzle 83 around the axis AX2 located outside the substrate W. In contrast to this, in Embodiment 2, the nozzle 83 may be moved toward outside of the substrate W by moving the nozzle 83 linearly along a radius of the substrate W.

Reference is made to FIG. 14A. A nozzle arm 89 is connected to a first end connected to the nozzle 83 and a second end connected to a fixed axis 111 not rotating. Similar to Embodiment 1, the nozzle arm 89 and the fixed axis 111 are provided with a processing liquid supplying pipe 93 for supplying a processing liquid PL to the nozzle 83. The processing liquid supplying pipe 93 is connected to a processing liquid supplying source 97 via a valve 95.

The nozzle 83 is moved freely in an m-direction with a nozzle moving mechanism 113. The nozzle moving mechanism 113 includes a movable unit 115, a guide rail 117, and a drive unit, not shown, such as a motor. The movable unit 115 holds the fixed axis 111. The movable unit 115 is movable along the guide rail 117 (in the m-direction). That is, the nozzle moving mechanism 113 moves the nozzle 83 in the radius direction of the substrate W between the center AX1 of the substrate W, a position spaced away from the center AX1 of the substrate W by a preset distance D and a retracting position outside the substrate W.

Figure 15A:
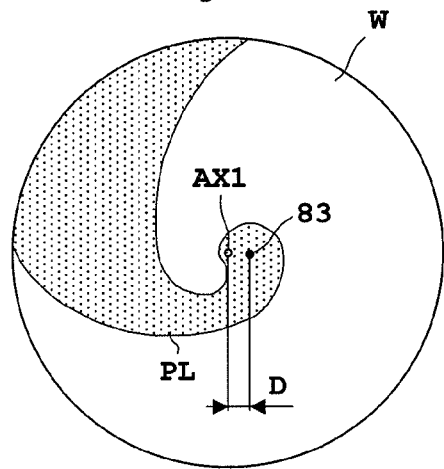
FIGS. 15A to 15F each illustrate cleaning and drying processes when the nozzle moves linearly.
Figure 15B:
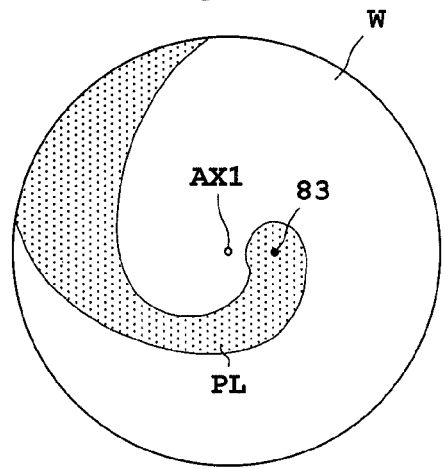
Figure 15C:
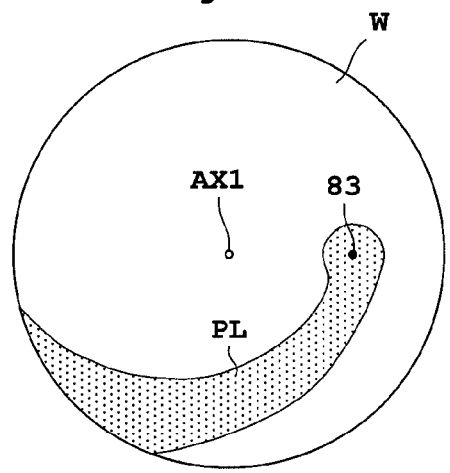
Figure 15D:
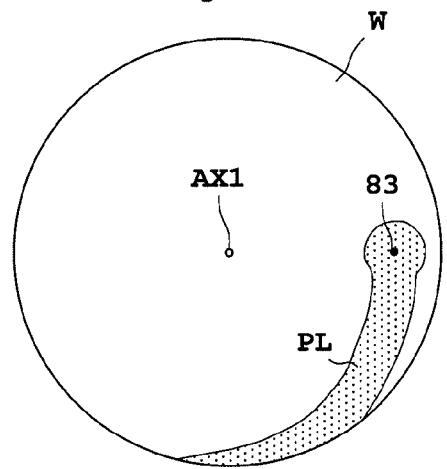
Figure 15E:
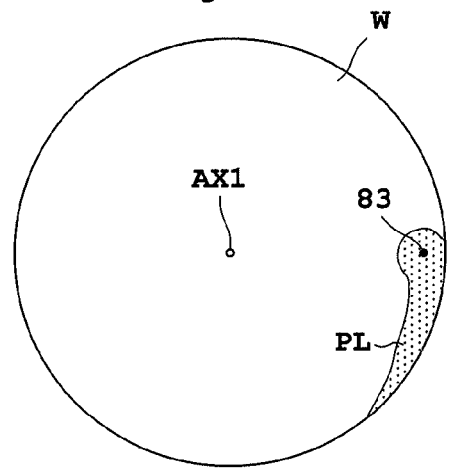
Figure 15F:
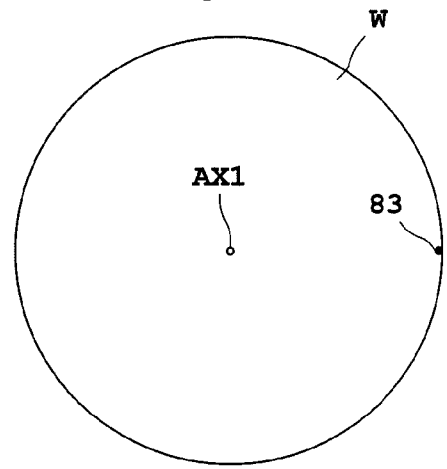

The following briefly describes operation of the cleaning/drying units 51 and 53. As illustrated in FIG. 15A, the nozzle 83 starts discharging the processing liquid PL to the position spaced away from the center AX1 of the substrate W by a preset distance D while the substrate W rotates. The processing liquid PL flows so as to converge into one stream on the substrate W immediately after being discharged. Then, as illustrated in FIGS. 15B to 15F, the nozzle 83 is moved toward outside of the substrate W while discharging the processing liquid PL successively. If the nozzle 83 is moved to a periphery edge of the substrate W or outside the substrate W, the nozzle 83 stops discharging the processing liquid PL. Successive discharge of the processing liquid PL from the nozzle 83 causes the processing liquid PL to flow continuously on the substrate W in one stream. Moreover, the nozzle 83 is moved while the processing liquid PL flows so as to converge into one stream. This allows suppression of minute water droplets. The nozzle 83 is finally moved to its retracting position.

With the present embodiment, the nozzle 83 is moved linearly in the radial direction of the substrate W. This allows the entire flow of the processing liquid PL to move toward outside of the substrate W while the processing liquid PL converging into one stream on the substrate W is maintained.

The present invention is not limited to the foregoing examples, but may be modified as follows.

(1) The nozzle 83 is pivoted around the axis AX2 outside the substrate W in Embodiment 1, whereas the nozzle 83 is moved linearly in Embodiment 2. However, the nozzle 83 is not imitatively moved toward outside of the substrate W in such manners as above. For instance, the nozzle 83 is merely movable in the m-direction (one-dimensional direction) along the guide rail 117 in Embodiment 2. Alternatively, the guide rail is provided so as to be movable also in an n-direction orthogonal to the m-direction, whereby the nozzle 83 is movable in the m- and n-directions (two dimensionally). Such is adoptable. Then, the nozzle 83 may be moved from a position of the nozzle 83 indicated by dashed dotted lines to a direction indicated by an arrow 119 in FIG. 14A. In such a case, the nozzle 83 is to be moved two dimensionally, which causes a more complex configuration than the case to be moved one-dimensionally.

(2) In the embodiments and the modification (1) mentioned above, the outlet 83a of the nozzle 83 is directed orthogonally (immediately below) to the surface of the substrate W as illustrated in FIG. 7B. Alternatively, the outlet 83a of the nozzle 83 may be inclined relative to the surface of the substrate W. That is, the direction of the outlet 83a is not particularly limited as long as the processing liquid PL discharged from the nozzle 83 reaches the position on the substrate W spaced away from the center AX1 of the substrate W by the preset distance D along the surface of the substrate W.

(3) In the embodiments and the modifications mentioned above, the resist film containing fluorine has been described as one example. However, this is not limitative. Examples of a water-repellent film may include a resist cover film covering a resist film entirely. The resist cover film is, for example, made from a fluorine resin. When the resist cover film is formed, the processing blocks B1 and B3 are each provided with an application processing unit COV. In addition, the processing blocks B2 and B4 are each provided with a removing unit REM removing the resist cover film prior to the developing process.

(4) In the embodiments and the modifications mentioned above, inactive gas is not particularly used when the entire flow of the processing liquid PL is moved toward outside the substrate W. However, this is not limitative. The following may be adopted. That is, at a timing when the liquid film at the substrate center AX1 of the processing liquid PL discharged from the nozzle 83 starts moving toward outside of the substrate W, a gas nozzle separately provided supplies inactive gas such as $N_2$ to the center AX1 of the substrate W, and moves the inactive gas toward outside of the substrate W while discharging in synchronization with the movement of the entire flow of the processing liquid PL toward outside of the substrate W, thereby assisting the movement of the processing liquid PL.

(5) In the embodiments and the modifications mentioned above, the nozzle 83 in each of the cleaning/drying units 51 and 53 in the IF section 7 discharges a cleaning liquid (e.g., deionized water) with no rinse to the substrate W as the processing liquid PL. Accordingly, only one processing is required, allowing reduction in processing time. However, the processing liquid PL is not particularly limited to a cleaning liquid with no rinse. That is, the processing liquid PL may be either a cleaning liquid and a rinse liquid or a rinse liquid.

Here, a solution of a complex (ionized) dissolved into deionized water or a fluorine chemical is used as the cleaning liquid. Moreover, any of deionized water, carbonated water, hydrogenated water, electrolytic ionized water, HFE (hydrofluoroether), and an organic liquid is used as a rinse liquid.

The substrate W is cleaned with the cleaning liquid, and thereafter, the substrate W is rinsed with the rinse liquid, as illustrated in FIGS. 8A to 8F, FIGS. 9A to 9F, and FIGS. 15A to 15F. Specifically, the spin chuck 81 holds the substrate W with the water-repellent resist film formed on the surface thereof. Then the chuck rotating mechanism 85 rotates the substrate W, and the substrate W is cleaned with the cleaning liquid. Then, the nozzle 83 starts discharging the rinse liquid to a position spaced away from the center AX1 of the substrate W by a preset distance D along the surface of the substrate W while the substrate W is rotated. The nozzle 83 is moved toward outside of the substrate W while successively discharging the rinse liquid.

Here, the substrate W is cleaned with the cleaning liquid in such a known manner as described in Japanese Unexamined Patent Publications No. 2008-028226A, 2009-071026A, and 2012-222237A. Alternatively, the substrate W may be cleaned with the cleaning/drying method of the present invention as illustrated in FIGS. 8A to 8F, FIGS. 9A to 9F, and FIGS. 15A to 15F.

Moreover, when the substrate W can be cleaned with the cleaning liquid while stopping its rotation, the following may be adopted. That is, the surface of the substrate W is cleaned with the cleaning liquid, and thereafter, the chuck rotating mechanism 85 rotates the substrate W for rinsing the surface of the substrate W with the rinse liquid.

(6) In the embodiments and the modifications mentioned above, the substrate W is cleaned and dried in the cleaning/drying units 51 and 53. However, the embodiments and the modifications may be applied to processes of cleaning and drying the substrate W by discharging the rinse liquid in the developing process unit DEV. However, in this case, the developed surface of the substrate W has to be substantially water-repellent entirely. The following is an applicable example. That is, a substrate W is rinsed with the rinse liquid, the substrate W having the water-repellent resist film formed thereon and having a plurality of minute holes formed on the resist film thereof after the developing process.

The present invention may be embodied in other specific forms without departing from the spirit or essential attributes thereof and, accordingly, reference should be made to the appended claims, rather than to the foregoing specification, as indicating the scope of the invention.

What is claimed is:

1. A substrate treating method of treating a substrate, the method comprising:
   holding and rotating a substrate using a rotation holder, the substrate having a water-repellent film being formed on a surface thereof;
   starting discharging a processing liquid through a nozzle aimed at one single position spaced away from the center of the substrate by a preset distance along a surface of the substrate, and flowing the processing liquid on a surface of the water-repellent film so as to cause the processing liquid to converge into one stream immediately after starting discharging the processing liquid;
   extending the spread of the processing liquid on the surface of the water-repellent film to the center of the substrate while still discharging the processing liquid aimed at the position spaced away from the center of the substrate; and then
   moving the nozzle from a discharge starting position toward outside of the substrate while continuing discharging the processing liquid through the nozzle.

2. The substrate treating method according to claim 1, wherein
   the moving of the nozzle is performed by pivoting the nozzle around a pre-set position outside the substrate.

3. The substrate treating method according to claim 1, wherein
   the moving of the nozzle is performed by moving the nozzle linearly in a radial direction of the substrate.

4. The substrate treating method according to claim 1, wherein
   the processing liquid is a cleaning liquid with no rinse.

5. The substrate treating method according to claim 2, wherein
   the processing liquid is a cleaning liquid with no rinse.

6. The substrate treating method according to claim 1, wherein
   the substrate is an uncleaned substrate subjected to exposure with an immersion method.

7. The substrate treating method according to claim 2, wherein
   the substrate is an uncleaned substrate subjected to exposure with an immersion method.

8. The substrate treating method according to claim 1, wherein said nozzle is one single nozzle disposed vertically above said position spaced away from the center, and said processing liquid is discharged vertically downward, toward said position spaced away from the center.

9. A substrate treating method of treating a substrate, the method comprising:
   holding and rotating a substrate using a rotation holder, the substrate having a water-repellent film being formed on a surface thereof;
   starting discharging a processing liquid through a nozzle aimed at one single position spaced away from the center of the substrate by a preset distance along a surface of the substrate without the processing liquid reaching the center of the substrate, and flowing the processing liquid on a surface of the water-repellent film so as to cause the processing liquid to converge into one stream immediately after starting discharging the processing liquid;
   extending the spread of the processing liquid on the surface of the water-repellent film to the center of the substrate while still discharging the processing liquid aimed at the position spaced away from the center of the substrate; and then moving the nozzle from a discharge starting position toward outside of the substrate while continuing discharging the processing liquid through the nozzle.

10. The substrate treating method according to claim 1, wherein no processing liquid film is formed on the surface of the water-repellent film.

11. The substrate treating method according to claim 1, wherein the nozzle is moved without passing over the center of the substrate.

12. The substrate treating method according to claim 1, wherein the flowing of the processing liquid does not form a film of the processing liquid on the surface of the water-repellent film.

13. The substrate treating method according to claim 4, wherein the flowing of the processing liquid does not form a film of the processing liquid on the surface of the water-repellent film.

14. The substrate treating method according to claim 5, wherein the flowing of the processing liquid does not form a film of the processing liquid on the surface of the water-repellent film.

15. The substrate treating method according to claim 9, wherein the flowing of the processing liquid does not form a film of the processing liquid on the surface of the water-repellent film.

16. The substrate treating method according to claim 9, wherein no processing liquid film is formed on the surface of the water-repellent film.

* * * * *